US 7,559,002 B2

United States Patent
Xiao et al.

(10) Patent No.: US 7,559,002 B2
(45) Date of Patent: *Jul. 7, 2009

(54) MULTI-THREAD PARALLEL SEGMENT SCAN SIMULATION OF CHIP ELEMENT PERFORMANCE

(75) Inventors: Wei-Yi Xiao, Poughkeepsie, NY (US); Dean Gilbert Bair, Bloomington, NY (US); Thomas Ruane, Poughkeepsie, NY (US); William Lewis, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/754,941

(22) Filed: May 29, 2007

(65) Prior Publication Data

US 2007/0255997 A1    Nov. 1, 2007

Related U.S. Application Data

(63) Continuation of application No. 11/040,140, filed on Jan. 21, 2005.

(51) Int. Cl.
*G01R 31/28* (2006.01)
*G06F 11/00* (2006.01)

(52) U.S. Cl. .................. 714/741; 714/726; 714/736; 714/819

(58) Field of Classification Search ............ 714/762, 714/724–727, 729, 733–734, 735–736, 799, 714/819, 741, 25, 30, 39, 47–49, 742; 716/4; 709/222, 221; 717/718
See application file for complete search history.

(56) References Cited

U.S. PATENT DOCUMENTS

| | | | | | |
|---|---|---|---|---|---|
| 711,216 | A | * | 10/1902 | Nalbantis | 137/625.47 |
| 4,817,614 | A | * | 4/1989 | Hassler et al. | 600/441 |
| 5,206,861 | A | * | 4/1993 | Hannon et al. | 714/731 |
| 5,452,437 | A | * | 9/1995 | Richey et al. | 714/4 |
| 5,539,735 | A | * | 7/1996 | Moskowitz | 370/420 |
| 5,867,507 | A | * | 2/1999 | Beebe et al. | 714/726 |
| 6,021,513 | A | * | 2/2000 | Beebe et al. | 714/726 |
| 6,349,398 | B1 | * | 2/2002 | Resnick | 714/733 |
| 6,535,915 | B1 | * | 3/2003 | Valys et al. | 709/222 |
| 7,225,374 | B2 | * | 5/2007 | Burdine et al. | 714/726 |

* cited by examiner

*Primary Examiner*—Phung M Chung
(74) *Attorney, Agent, or Firm*—Lynn L. Augspurger; John E. Campbell; Graham S. Jones, II

(57) ABSTRACT

A microprocessor simulation method, system, and program product, which are built upon the underlying hardware design of the microprocessor, stop normal functions of a simulation testcase, start the scan clocks, and record a first "snap shot" of the scan ring data at an initial time. The hardware logic then rotates (shifts) the scan ring using the current scan data, and when the scan clock stops (where the stop of the scan clock is controlled based on the number of latches on the scan ring), another "snap shot" of scan ring data is taken. The "snap shots" are compared and if both of the "snap shots" are identical the functional scan is successful. But if the functional scan verification fails to rotate the scan chain correctly, that is, if some of the latches do not match in the two "snap shots," it becomes necessary to locate the broken spot within the large number of scan latches.

1 Claim, 7 Drawing Sheets

MULTI-THREAD PARALLEL SEGMENT SCAN SIMULATION OF CHIP ELEMENT PERFORMANCE

CROSS REFERENCE TO RELATED APPLICATION

Figure 1:
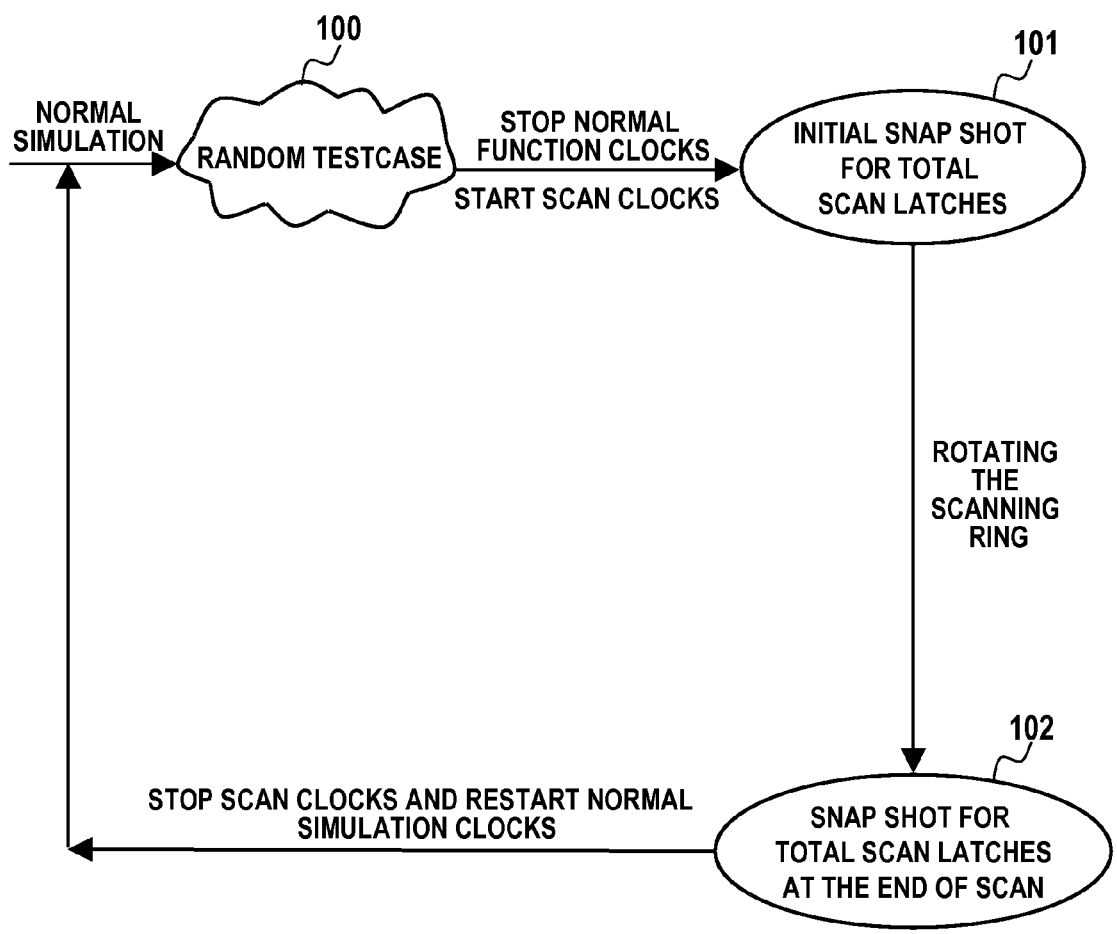

This is a continuation application of our commonly assigned, copending U.S. patent application Ser. No. 11/040,140 filed Jan. 21, 2005.

BACKGROUND

1. Field of the Invention

The invention relates to simulation and testing of integrated circuit performance, and more particularly to segment scan simulation of integrated circuit element performance.

2. Background Art

In the design of a large scale microprocessor, with many issues of complex architectural design, circuit design, CAD design, and photomask design, a successful functional scan verification of the many elements of the microprocessor becomes critical to the successful reduction of these elements to a Release Instruction Tape ("RIT"). One way of accomplishing design and fabrication verification is through the use of a scan ring. A scan ring, designed into the microprocessor, is a chain of serially connected latches. In this context, the chain or chains of serially connected latches are used for initialization and/or debugging of the microprocessor.

However, if the scan ring is defective or broken, basic access to the device is limited and quick accurate diagnosability becomes a severe problem. Therefore, the scannability of the scan ring is often simulated and verified before the design is reduced to a Release Instruction Tape. The scannability of the scan ring is deemed verified if the scan ring is shifted once completely around the scan ring and each latch on the ring retains its initial scan data at the end of shifting.

If the full scan ring fails to rotate (shift) successfully, there are several methods used traditionally to detect and diagnose the specific broken area of the scan ring. However, these methods are not only time consuming, but they may fail to detect the broken ring during simulation.

Thus, a clear need exists for an improved apparatus and method for diagnosing the broken functional rings of the microprocessor.

SUMMARY OF THE INVENTION

The simulation method, system, and program product of our invention builds upon the underlying hardware design of the microprocessor. The method, system, and program product stops normal functions of a simulation testcase, starts the scan clocks, and records a first "snap shot" of the scan ring data at this initial time. The hardware logic then rotates (shifts) the scan ring using the current scan data, and when the scan clock stops (where the stop of the scan clock is controlled based on the number of latches on the scan ring), another "snap shot" of scan ring data is taken. According to our invention, the "snap shots" are compared and if both of the "snap shots" are identical the functional scan is successful. But if the functional scan verification fails to rotate the scan chain correctly, that is, if some of the latches do not match in the two "snap shots," it becomes necessary to locate the broken spot within the large number of scan latches. Several methods have heretofore been used to identify such problem latches.

One method is to rerun the testcase with the same scan scheme, and during the rotation (shift) of the scan, adding an extra check to compare the transition of every pair of latches. If an unexpected transition is seen, this unexpected transition can pinpoint a defective latch. But such methods are inherently time-consuming, comparing the whole scan ring each time the scan clock advances by "1" clock. If there are a million latches on the scan ring, it will take one million latches multiplied by another one million checks to locate the defective latch.

Another method is to set initial pattern of "0101", such that every even latch stores a "0" and odd latch stores a "1", and clocking the scan ring by one A/B scan clock. The final value of the latch is checked and compared with the expected data. But this method also presents its own defect. If a circuit is designed incorrectly and has some other value that overrides the scan data, this patterning method can fail to detect the failing spot.

A third method is to check that a single latch is moving along the scan ring during the rotation (shifting). This method has the same problem as the second method, described above.

To combine the advantages of each of the methods above, we describe a parallel sectional scan method, system, and program product. The scan ring is subdivided into several sections. An initial value may be optionally stored in the beginning of each scan section. As each scan clock advances, the transition of each latch is monitored. In addition, with a given number of sections, the sections can be spun off to do checking using different threads. This method has the advantage of being able to monitor latches during each step of the scan and is resistant to the performance problems of the prior art by using different threads.

THE FIGURES

Various aspects of our invention are illustrated in the drawings appended hereto.

FIG. 1 is an illustration of functional scan verification with a selected random simulation testcase, where the normal function clocks are stopped and individual scan clocks are started to start the shifting of the scan data around the scan ring, with "snap shots" of the scan data for the latches being taken. This is followed by a subsequent set of "snap shots" of the scan data to be compared with the initial snap shot. Thereafter, the scan clocks are stopped and the normal function clocks are restarted again for the normal simulation testcase to continue.

Figure 2:
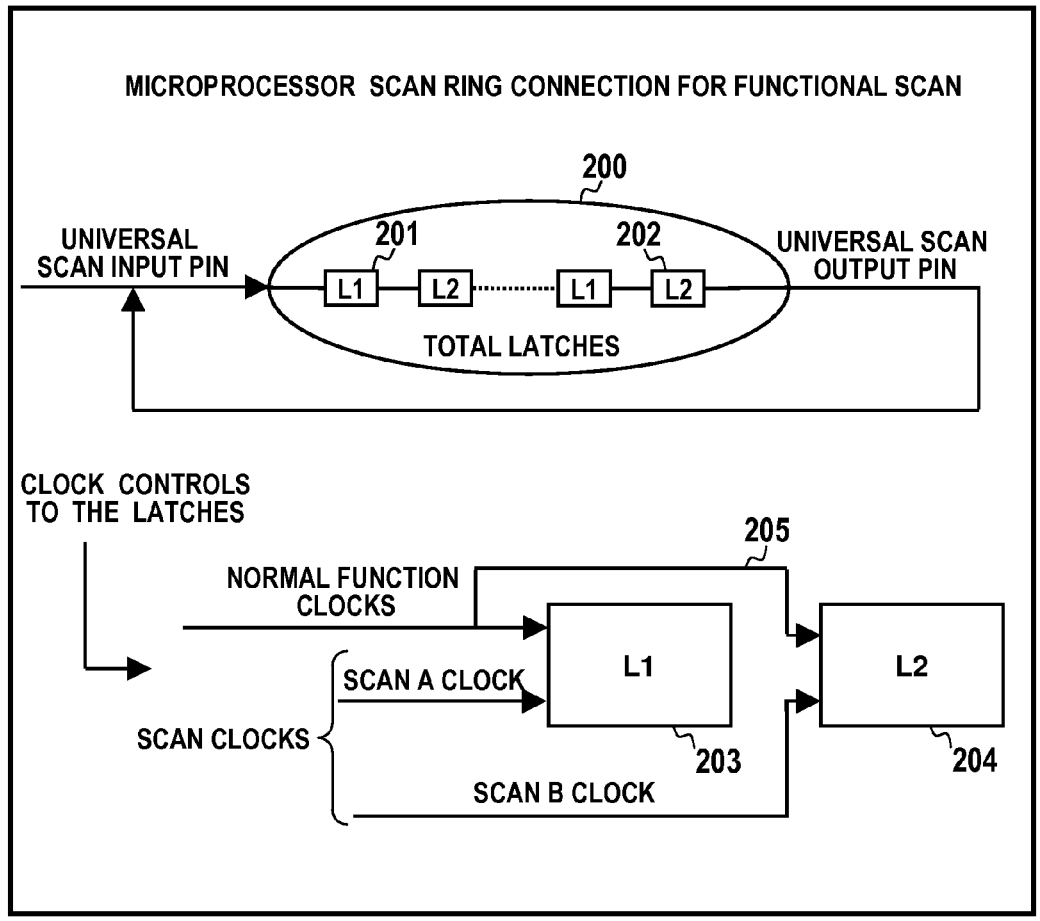

FIG. 2 illustrates the basic connections of the processor latches for functional scan verification of a processor.

FIG. 3 illustrates two methods of locating the broken chain if a functional scan fails. One method compares all of the latches to their expected shifted values in every scan. In the alternative method, when the normal function clocks are stopped, the initial pattern is stored into the scan chain so that each even latch has a value of "0", each odd latch has a value of "1", and only L2 latches of the scan chain are used in this case.

Figure 4:
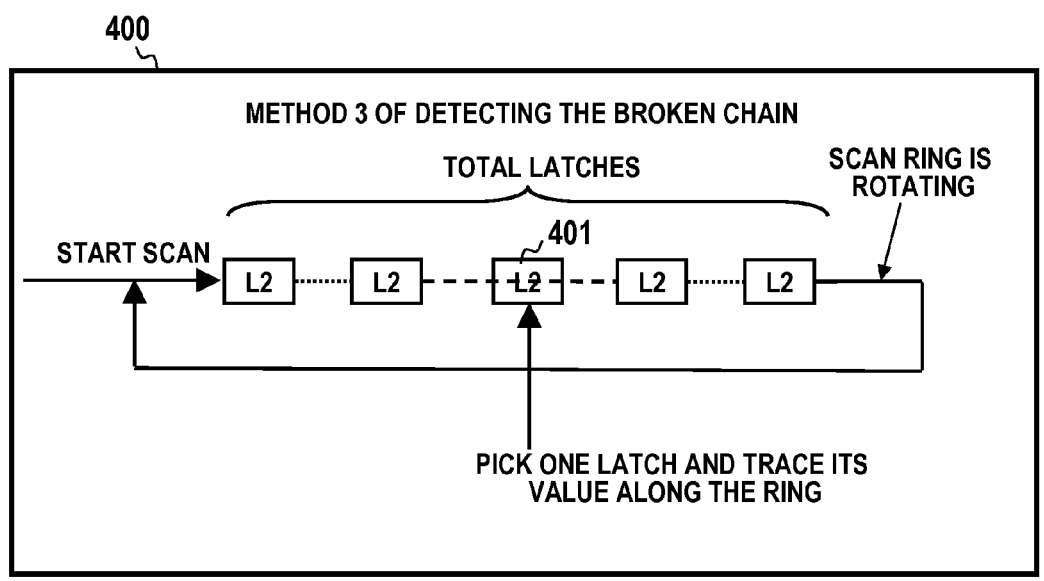

FIG. 4 shows another method of locating the broken chain if the functional scan fails. The illustrated method shows checking one particular set of scan latch data that is moving along the scan chain. As there shown, a particular latch is picked from the scan chain, and its value is monitored during the shifting of the ring. Then, a subsequent latch is checked against this expected value during the scan. The broken location can be located where unexpected scan data is detected. This method can be used if a known area is suspected to be broken.

Figure 5:
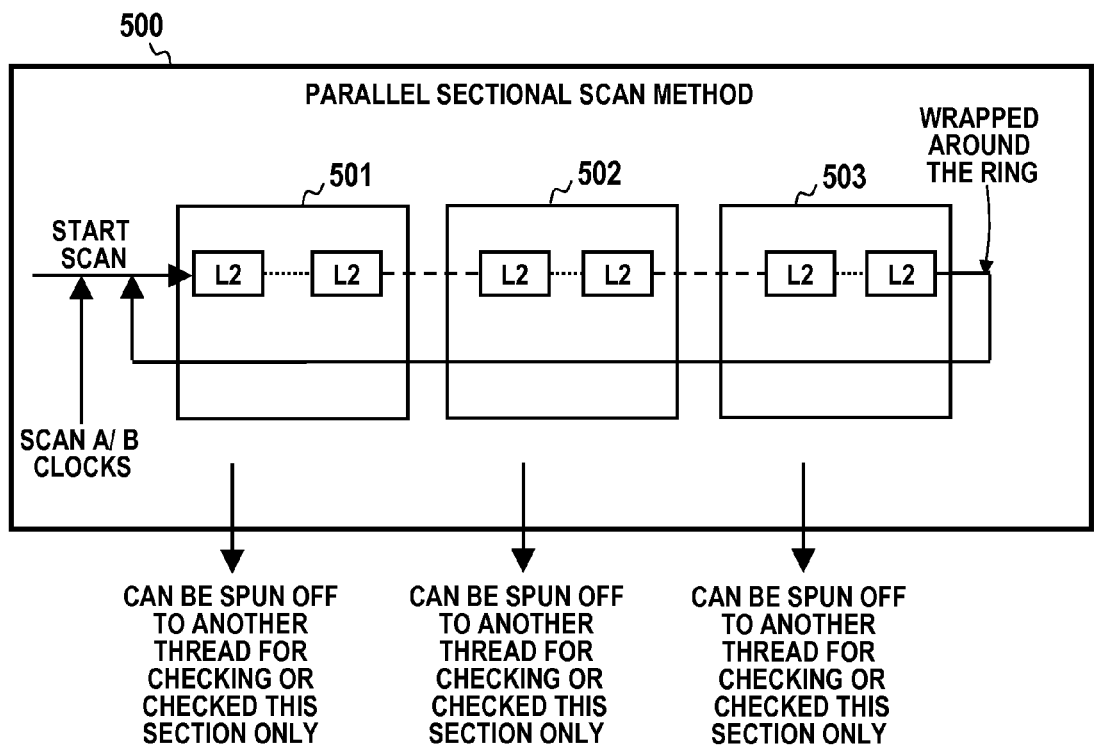

FIG. 5 illustrates a parallel scan exemplification where the scan ring is divided into a number of sections where, during each A/B clock, each section can be spun off to another thread for comparing the transition values between two latches.

Figure 6:
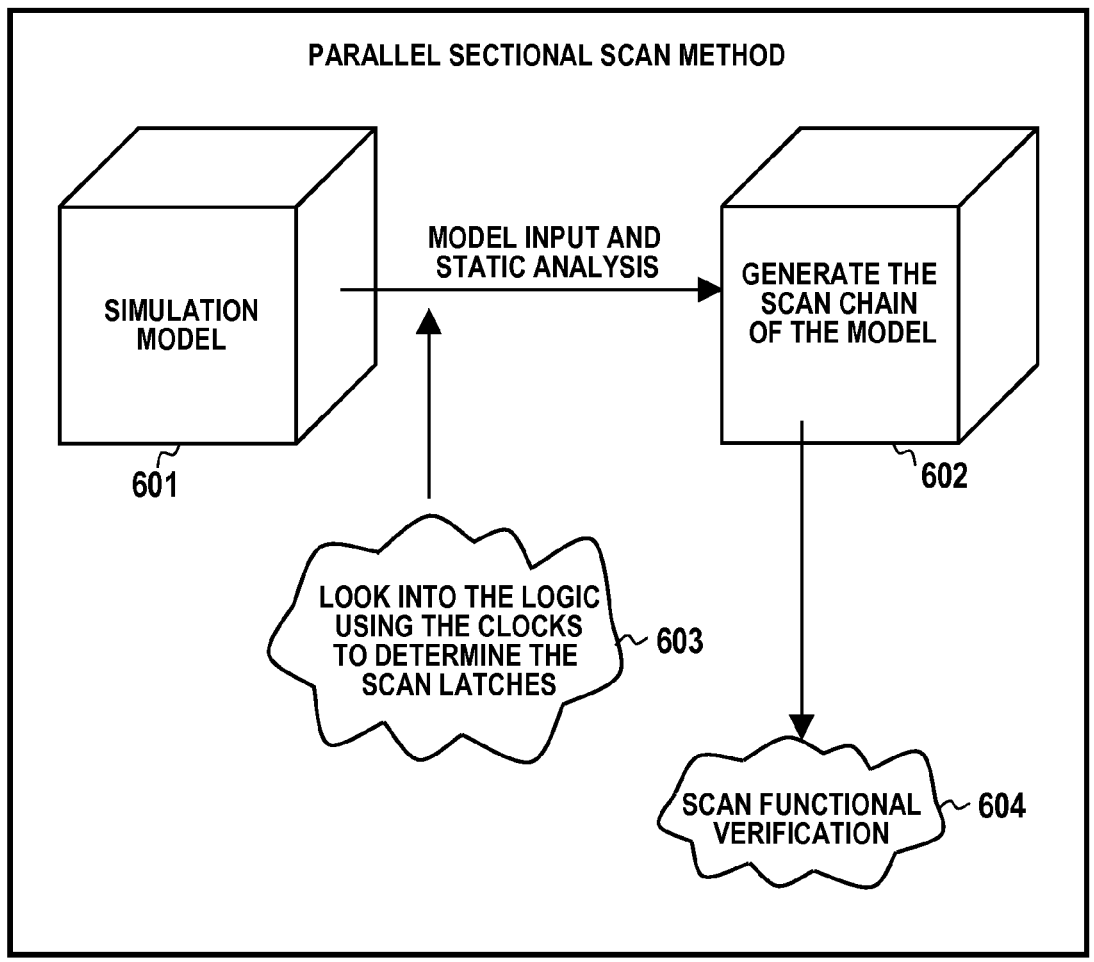

FIG. 6 illustrates the generation of a scan chain that feeds into the functional scan verification. The illustrated method traces the logic to find the connected scan latches in the logic which are fed from the model inputs. If there is no broken logic, the scan chain is generated successfully as a scan ring.

Figure 7:
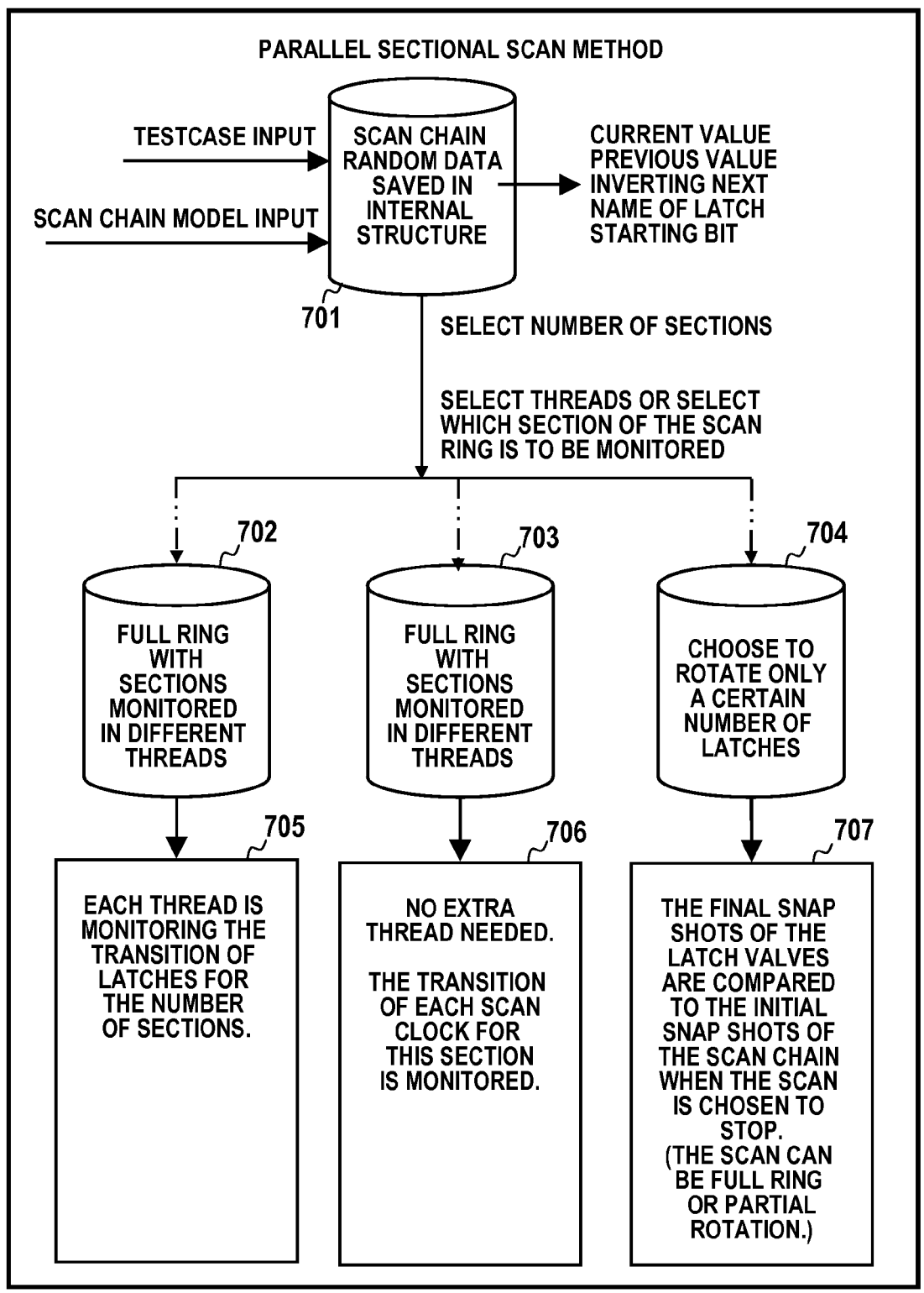

FIG. 7 shows the three different exemplifications of the parallel sectional scan method.

DETAILED DESCRIPTION

The simulation method, system, and program product of our invention utilizes the underlying hardware design of the microprocessor to self-test the microprocessor. Specifically, the method, system, and program product stops normal functions of a simulation testcase, starts the scan clocks, and records a first "snap shot" of the scan ring data at this initial time. The hardware logic then rotates (shifts) the scan ring using the current scan data, and when the scan clock stops (where the stop of the scan clock is controlled based on the number of latches on the scan ring), the hardware logic takes another "snap shot" of scan ring data.

According to our invention, these "snap shots" are compared and if both of the "snap shots" are identical the functional scan is deemed successful. But if the functional scan verification fails to rotate the scan chain correctly, that is, if some of the latches do not match in the two "snap shots," it becomes necessary to locate the broken spot within the large number of scan latches.

FIG. 1 shows the general purpose of the functional scan verification. As shown in FIG. 1, a random simulation testcase 100 is selected. The testcase could start with the normal simulation function. As part of the procedure, the normal function clocks are stopped and scan clocks are started 101 to start the shifting of the scan data around the scan ring. At this time, the initial snap shots 101 of the scan data for the total latches are taken. When the scan ring has been completely shifted, another subsequent snap shot 102 of the scan data for the latches is taken. The subsequent snap shot 102 is taken at the end of the scan. This subsequent snap shot 102 is compared to the initial snap shot 101. At this time, the scan clocks are stopped and the normal function clocks are restarted again for the normal simulation testcase to continue. If the functional scan is successful, the testcase will be ended successfully given that it was a functionally successful scantest.

FIG. 2 shows a high level representation of the basic connections of the processor latches. Element 200 contains all of the latches in the processor, where latch 201 is the first latch in the scan ring or chain and connects to a universal input pin. Latch 202 is the last latch in the scan ring that connects to an universal scan output pin which also connects to a universal scan in pin. Each latch consists of L1/L2 latches. All of the latches are gated by normal function clocks and scan clocks. The L1/L2 latches are typically gated by scan A/B clocks. When the scan A clock is on, scan data is shifted into the L1 latch. When the B clock is on, the scan data is shifted into the L2 latch. Normally, a separate program is run to generate a latch file containing all the connected latch facilities from the first latch to the last latch of the processor.

Figure 3A:
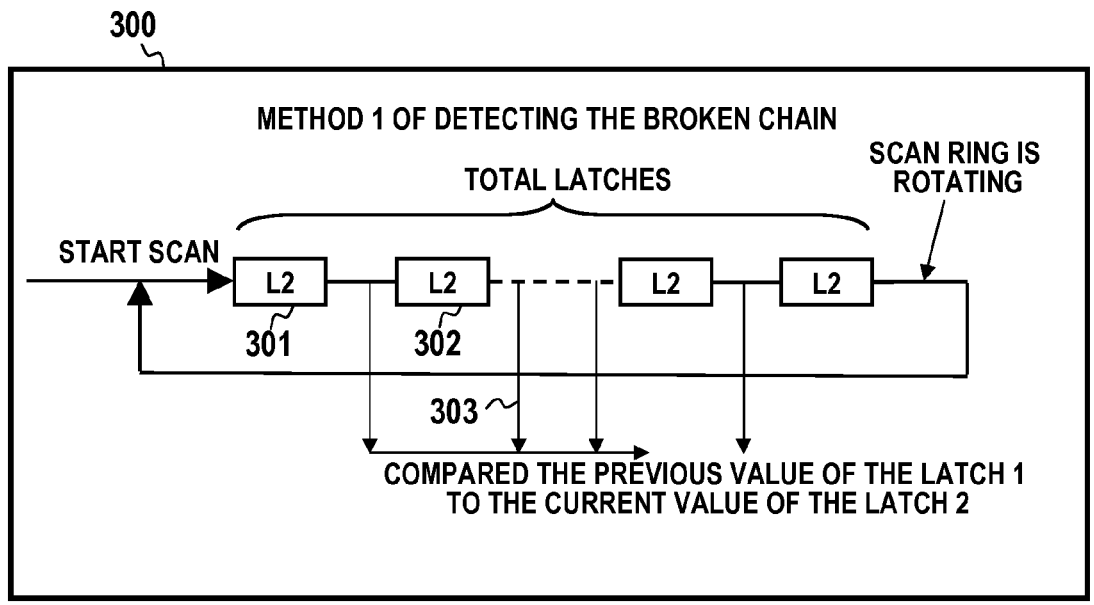
Figure 3B:
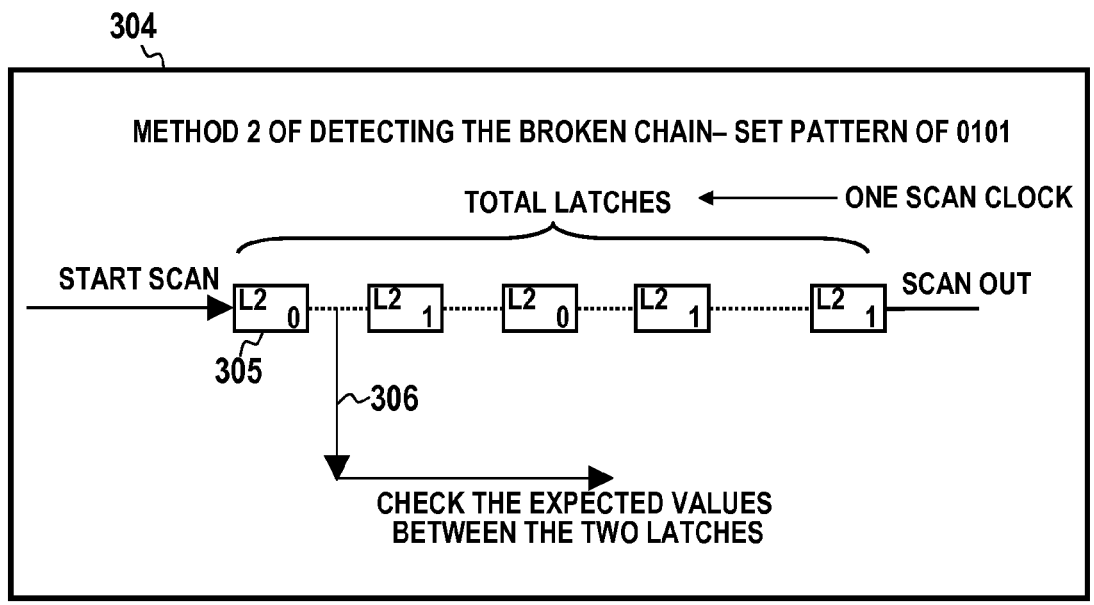

FIGS. 3A and 3B show two methods of locating the broken chain if the functional scan fails. In FIG. 3A, element 300 is a method that compares all the latches to its expected shifted values in every one of the scan A/B clocks. The previous values of each L2 latch are saved. When the scan B clock is on, the current latch value is obtained and compared to its precedent latch's previous value together with its polarity. If there is miscompare, the latch is defective. L2 latch elements 301 and 302 show that only the L2 latches need to be considered in this case. Element 303 is a checking step during scan between two L2 latches. This method finds the defective latch during the functional scan; but if the processor is a very large design this method can be very time consuming since during the shift of each scan clock, every transition of the latch on the scan ring is checked.

In FIG. 3A, element 304 represents another method used to detect the broken scan chain. When the normal function clocks are stopped, the initial pattern of "0101" is stored into the scan chain so that each even latch has value of "0", and each odd latch has value of "1." Only L2 latches of the scan chain are used in this case. The scan chain is shifted by one of the A/B clocks. At the end of one A/B clock, all the latches are expected to have opposite scan data. This method can point out whether the L1/L2 transition within a latch is broken.

FIG. 4 shows another method of locating the broken chain if the functional scan fails. Element 400 illustrates the method of checking one particular scan latch data that is moving along the scan chain. In this method, before the scan starts, one particular latch is picked from the scan chain. Its value is monitored during the shifting of the ring. The subsequent latch is checked against this expected value during the scan. The broken location can be located if unexpected scan data is detected. If the particular latch 401 is picked carefully, the length of simulation can be shortened to find the defective latch. This method can be used if a known area is suspected to contain a broken latch.

FIG. 5 illustrates a parallel sectional scan method. In this method, the scan ring is divided into a number of sections chosen by the user. (There are three sections in this case, Section 501, Section 502 and Section 503). The scan A/B clocks clock the number of latches in the ring. The first latch of each section 501, 502, or 503 is optionally stored with a "1" initially. During each A/B clock, each section 501, 502, and 503 can be spun off to another thread for comparing the transition values between two latches. Alternatively, only one of these three sections 501, 502, or 503 can be selected for monitoring. Or, these three sections of latches 501, 502, and 503 can be monitored simultaneously using three different threads.

FIG. 6 shows the generation of the scan chain that feeds into the scan functional verification 604. Element 603 is a scan generation (scangen) program that looks into a simulation model 601 that was built for the hardware. The program traces the logic to find the connected scan latches in the logic which are fed from the model inputs. If there is no broken logic, the scan chain is generated successfully as a scan ring. This scan ring contains a list of hardware facility names stored in a file 602 which is later used to verify the rotation of the ring.

FIG. 7 shows the three different ways of using the parallel sectional scan method. Element 701 represents the initial set up. The method takes a random testcase and a scan chain model input. It saves the initial values of the scan ring in a data structure that contains the current value, the previous value, the inverting next, the starting bit, and the name of the latch before the scan clocks start. A configuration file is provided for user to select number of sections of the ring, threads, or whether a particular section of the ring needs to be monitored. If multiple threads are selected 702, the scan ring is subdivided into multiple sections and each section is sent off to be monitored in different threads 705. If only one section is selected 703, only the transition of that section is monitored.

If only one section of the ring is to be rotated 704, after rotating the section, the comparison of snapshots in element 707 provides the resulting pattern of the rotation of the ring compared to the initial pattern of the ring.

The invention may be implemented, for example, by having the segment scan simulation engine as a software application (as an operating system element), a dedicated processor, or a dedicated processor with dedicated code. The segment scan simulation engine executes a sequence of machine-readable instructions, which can also be referred to as code. These instructions may reside in various types of signal-bearing media. In this respect, one aspect of the present invention concerns a program product, comprising a signal-bearing medium or signal-bearing media tangibly embodying a program of machine-readable instructions executable by a digital processing apparatus to perform a method for segment scan simulation.

This signal-bearing medium may comprise, for example, memory in a server. The memory in the server may be non-volatile storage, a data disc, or even memory on a vendor server for downloading to a processor for installation. Alternatively, the instructions may be embodied in a signal-bearing medium such as the optical data storage disc. Alternatively, the instructions may be stored on any of a variety of machine-readable data storage mediums or media, which may include, for example, a "hard drive", a RAID array, a RAMAC, a magnetic data storage diskette (such as a floppy disk), magnetic tape, digital optical tape, RAM, ROM, EPROM, EEPROM, flash memory, magneto-optical storage, paper punch cards, or any other suitable signal-bearing media including transmission media such as digital and/or analog communications links, which may be electrical, optical, and/or wireless. As an example, the machine-readable instructions may comprise software object code, compiled from a language such as "C++".

Additionally, the program code may, for example, be compressed, encrypted, or both, and may include executable files, script files and wizards for installation, as in Zip files and cab files. As used herein the term machine-readable instructions or code residing in or on signal-bearing media include all of the above means of delivery.

While the foregoing disclosure shows a number of illustrative embodiments of the invention, it will be apparent to those skilled in the art that various changes and modifications can be made herein without departing from the scope of the invention as defined by the appended claims. Furthermore, although elements of the invention may be described or claimed in the singular, the plural is contemplated unless limitation to the singular is explicitly stated.

We claim:

1. A method of simulating integrated circuit performance of a scan ring having a plurality of serially connected latches in a scan chain, said method comprising:
   1) starting a scan clock for a functional scan of a scan chain;
   2) recording a first "snap shot" of scan ring data;
   3) starting a scan ring;
   4) shifting the scan ring using the current scan data;
   5) stopping the scan clock when said scan ring has been completely shifted and then taking a second "snap shot" of scan ring data; and
   6) comparing the first "snap shot" and the second "snap shot;"

wherein if the first "snap shot" and the second "snap shot" are not identical; then thereafter locating a broken spot within the scan latches of the scan ring;

wherein each latch comprises an L1 latch and an L2 latch, gated by normal function clocks and scan A/B clocks including a scan A clock and a scan B clock;
   wherein:
   when said scan A clock is on, shifting scan data into the L1 latch; and
   when said scan B clock is on, shifting scan data into the L2 latch; and locating a broken chain if the functional scan fails, comprising the steps as follows:
   1) comparing the latches to their expected shifted values in every scan of the scan A clock and the scan B clock;
   2) saving previous values of each of a plurality of L2 latches; and
   3) obtaining a current latch value and comparing it to a previous value of a precedent latch.

* * * * *